United States Patent [19]

Pumphrey

[11] Patent Number: 5,332,340
[45] Date of Patent: Jul. 26, 1994

[54] DRILLING METHOD AND APPARATUS USING VARIABLE DWELL TIMES

[75] Inventor: Dennis M. Pumphrey, Torrance, Calif.

[73] Assignee: Excellon Automation, Torrance, Calif.

[21] Appl. No.: 919,874

[22] Filed: Jul. 27, 1992

[51] Int. Cl.⁵ .............................................. B23B 35/00
[52] U.S. Cl. ................................ 408/1 R; 364/474.02; 364/474.11; 408/3; 483/4
[58] Field of Search ................... 408/1 R, 3, 13, 91; 483/4, 11; 364/474.11, 474.17, 474.02

[56] References Cited

U.S. PATENT DOCUMENTS

| | | |
|---|---|---|
| 3,973,863 | 8/1976 | Smith . |
| 4,000,954 | 1/1977 | Patel ........................................ 408/3 |
| 4,037,982 | 7/1977 | Clement . |
| 4,088,417 | 5/1978 | Kosmowski ...................... 408/1 R |
| 4,468,159 | 8/1984 | Oster . |
| 4,520,551 | 6/1985 | Imhof . |
| 4,658,094 | 4/1987 | Clark . |
| 4,761,876 | 8/1988 | Kosmowski . |
| 4,790,694 | 12/1988 | Wilent et al. ...................... 408/1 R |
| 4,813,825 | 3/1989 | Kosmowski . |
| 4,822,219 | 4/1989 | Wood et al. . |
| 4,865,494 | 9/1989 | Gudow . |
| 4,915,550 | 4/1990 | Arai et al. . |
| 4,917,547 | 4/1990 | Frederickson et al. . |
| 4,984,352 | 1/1991 | Reed et al. . |
| 5,087,156 | 2/1992 | Kanaya et al. . |

FOREIGN PATENT DOCUMENTS

| | | |
|---|---|---|
| 386378 | 3/1989 | European Pat. Off. . |
| 2539120 | 9/1975 | Fed. Rep. of Germany . |
| 869256 | 1/1942 | France . |
| 61-86156 | 5/1986 | Japan . |
| 188207 | 7/1989 | Japan . |
| 243210 | 9/1990 | Japan . |
| 06167 | 4/1987 | PCT Int'l Appl. . |

OTHER PUBLICATIONS

One page brochure regarding Posalux SA.

Primary Examiner—Daniel W. Howell
Attorney, Agent, or Firm—Knobbe, Martens, Olson & Bear

[57] ABSTRACT

A method and apparatus for increasing the speed and efficiency of a drilling machine during the drilling of holes in printed circuit boards includes automatically setting a dwell time according to one or more predefined drilling parameters. A plurality of dwell times which vary in accordance with the predefined parameters are stored in a computer memory device. A drilling machine controller automatically selects an optimal dwell time from the memory device according to the drilling conditions of a particular drilling operation so that the shortest feasible dwell time is used for obtaining a desired degree of hole placement accuracy and hole quality for the drilling operation. The apparatus is a drilling machine system that includes a controller which contains dwell times that vary in accordance with the diameter of a drill tool.

12 Claims, 5 Drawing Sheets

FIG. 4

| HOLE SIZE | DESIRED ACCURACY | | |
|---|---|---|---|
| | HIGH HOLE ACCURACY (LOW THROUGHPUT) | MEDIUM HOLE ACCURACY (AVERAGE THROUGHPUT) | ACCEPTABLE LOW HOLE ACCURACY (HIGH THROUGHPUT) |
| MICRO HOLE DRILLING (0.0039-INCH TO 0.0100-INCH) | DWELL TIME: 150ms | DWELL TIME: 90ms | DWELL TIME: 40ms |
| SMALL HOLE DRILLING (0.0110-INCH TO 0.0200-INCH) | DWELL TIME: 90ms | DWELL TIME: 30ms | DWELL TIME: 20ms |
| MEDIUM HOLE DRILLING (0.0210-INCH TO 0.0700-INCH) | DWELL TIME: 50ms | DWELL TIME: 30ms | DWELL TIME: 20ms |
| LARGE HOLE DRILLING (0.0710-INCH TO 0.2650-INCH) | DWELL TIME: 30ms | DWELL TIME: 20ms | DWELL TIME: 20ms |

DRILLING METHOD AND APPARATUS USING VARIABLE DWELL TIMES

FIELD OF THE INVENTION

The present invention relates generally to the field of printed circuit board drilling machines, and in particular to an improved method for drilling printed circuit boards to increase the efficiency of such drilling machines by optimizing drilling dwell times.

BACKGROUND OF THE INVENTION

In the manufacture of printed circuit boards for industrial use, frequently literally thousands of small diameter holes must be drilled into each circuit board so that appropriate electronic components may be mounted into the holes and soldered onto the boards. In volume production of the circuit boards, the drilling of holes is accomplished by computer controlled automatic drilling machines in which the printed circuit boards are usually mounted on a worktable movable in a horizontal X-Y plane. Usually, the worktable is moved horizontally in an incremental fashion beneath one or more drill spindles so that the pin holes may be drilled at appropriate drilling locations. Drilling of the circuit boards is accomplished by advancing each drill spindle downward through a vertical drilling stroke. This is a very rapid and satisfactory procedure for the mass production of printed circuit boards.

Since the diameter of the holes drilled in the printed circuit boards can be extremely small, for example on the order of the size of human hairs, it is imperative that the positioning of the holes at the appropriate drill locations or drill sites be exact and precisely controlled. This is particularly true where, as is often the case, components are subsequently mounted into the circuit boards automatically by machines which rely on predefined and precise placement and positioning of the holes.

During a normal drilling process, the worktable moves incrementally from drill site to drill site so that the spindle, which holds a drill tool, may drill a hole at each such predefined drill site before proceeding to the next drill site. As the worktable approaches each new predefined drill site and positions itself at the drill site, a computer control system delays initiation of the drill stroke for a predefined period of time. This delay allows the controller to further refine the position of the worktable relative to the drill spindle. Also, the delay results in a decrease in the velocity of the worktable. This period of delay is known as a "dwell time." The longer the dwell time, the more precisely the worktable can be positioned, thereby increasing the degree of hole placement accuracy.

An undesirable consequence of lengthy dwell times prior to each drilling operation is an increase in the time required to drill each hole and therefore a decrease in the efficiency or "throughput" of the drilling machine. Although the dwell time for any single hole is relatively short, each circuit board drilled usually requires the drilling of thousands of holes, for example as many as 20,000 or more holes per board. Consequently, when the dwell time for each hole is multiplied by the number of holes to be drilled in the board, a substantial increase in the overall time required to drill a single circuit board results.

In the prior art, a nominal dwell time is used for each drilling machine. Where a nominal dwell time is used, the chosen dwell time is normally longer than necessary for many drilling operations, thus ensuring that the worktable is given sufficient time to refine its position. Consequently, time is normally consumed in achieving a level of hole placement accuracy and stability that frequently is not warranted under the particular drilling conditions and requirements of that drilling operation. Over the course of drilling hundreds of thousands of holes, a substantial amount of time is unnecessarily wasted and the throughput of the drilling machine suffers significantly. Conversely, in some situations, the nominal dwell time chosen may not provide a sufficient level of hole placement accuracy for certain sensitive drilling operations and, in such a case, hole accuracy and thus product quality suffers unacceptably.

Thus, a method and apparatus is needed for optimizing the dwell times used during the drilling of printed circuit boards in order to improve the throughput of the drilling machine, and the quality and accuracy of the holes drilled.

SUMMARY OF THE INVENTION

The present invention relates to a method for decreasing the overall dwell time required during the drilling of printed circuit boards, and an apparatus which employs that method. In a printed circuit board drilling machine including a movable worktable and a printed circuit board mounted thereon, the present inventive method includes the steps of storing a plurality of predefined dwell times which vary according to one or more predefined drilling parameters, selecting a drill tool for drilling the printed circuit board, automatically selecting from the predefined dwell times an optimal dwell time corresponding to the particular conditions of the drilling operation, moving the worktable toward the desired drill location, and delaying initiation of the drilling operation for the duration of the dwell time. The dwell time is selected in accordance with the predefined drilling parameters so as to obtain a satisfactory degree of hole placement accuracy and hole quality while obtaining the optimal feasible drilling machine efficiency. Preferably, a deadband zone is defined around the desired drill location and the dwell time is counted from the point in time when the worktable enters the deadband.

Also disclosed is a drilling machine system which includes a computer controller in which is stored a plurality of dwell time values that vary in accordance with the diameter of the drill tool used and other parameters in order to optimize machine efficiency and hole quality.

BRIEF DESCRIPTION OF THE DRAWINGS

FIG. 4 is a reference table showing different dwell times based on hole size and desired accuracy parameters.

DESCRIPTION OF THE PREFERRED EMBODIMENT

Figure 1:
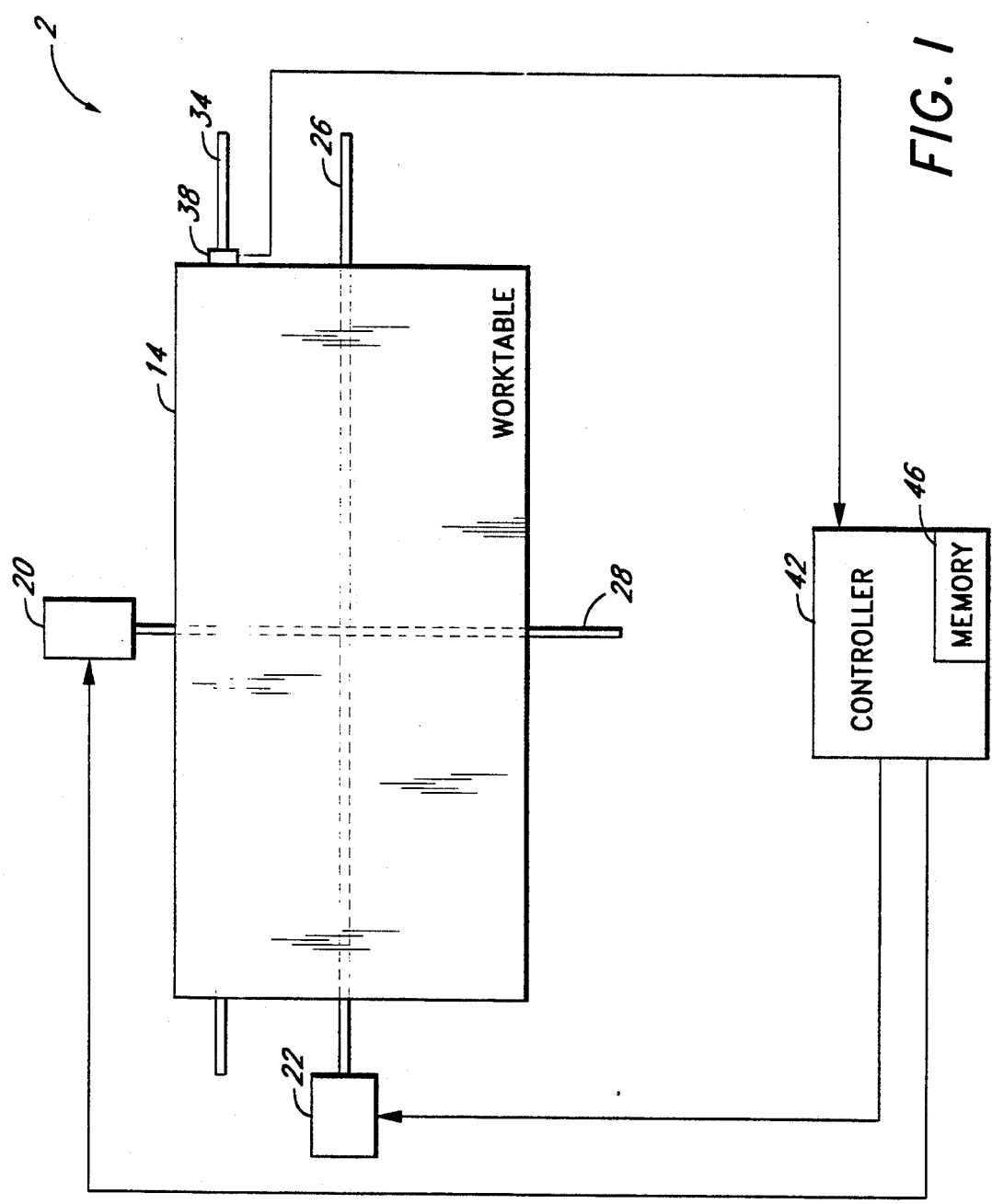
FIG. 1 is a schematic diagram of a worktable movement assembly on a drilling machine.
Figure 2:
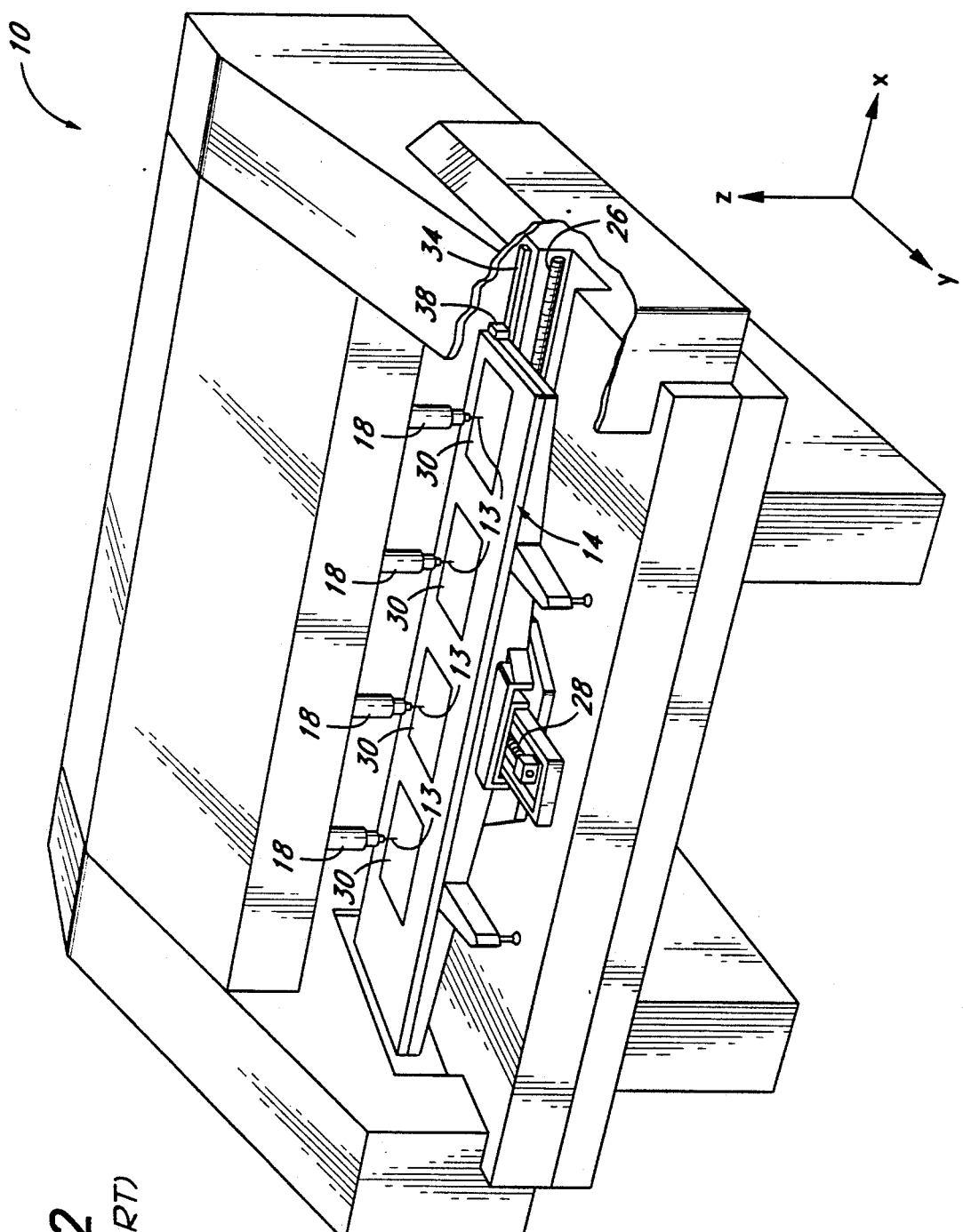
FIG. 2 is a perspective view of a typical printed circuit board drilling machine.

Referring to FIGS. 1 and 2, a typical printed circuit board drilling machine 10 is shown, including a worktable 14. The worktable 14 is movable in a horizontal plane and may move either along a single axis defined by an X-axis or along two axes defined by an X-axis and a Y-axis. The worktable 14 is displaced by the rotation of lead screws 26 and 28, which are parallel to the X and Y axes, respectively. As is well known in the art, the lead screws are driven by respective motors 20 and 22, as is shown schematically in FIG. 2. The motors 20 and 22, lead screws 26 and 28, and associated hardware are referred to collectively as the worktable movement assembly 11. As will be appreciated by those skilled in the art, alternative types of worktable movement assemblies can be employed to cause displacement of the worktable 14.

One or more spindles 18 on the drilling machine 10 are movable along a vertical or Z axis. Drill tools 13 are mounted on the spindles 18. Printed circuit boards 30 are mounted on the worktable 14 to be drilled by the drill tools 13 on the spindles 18. As shown in FIG. 1, a computer controller 42 of the type well known in the art, such as a single board computer having a Motorolla 68020 CPU, including a memory device 46, is also provided for monitoring and controlling the various operations of the drilling machine 10, including displacement of the worktable movement assembly 11.

A positioning scale 34, including a read head 38, is provided on the drilling machine 10 for determining the precise location of the worktable 14 at any given point in time. The positioning scale 34 provides feedback to the controller on the precise position of the worktable 14. Preferably, the positioning scale 34 is accurate to about one micron.

Figure 5:
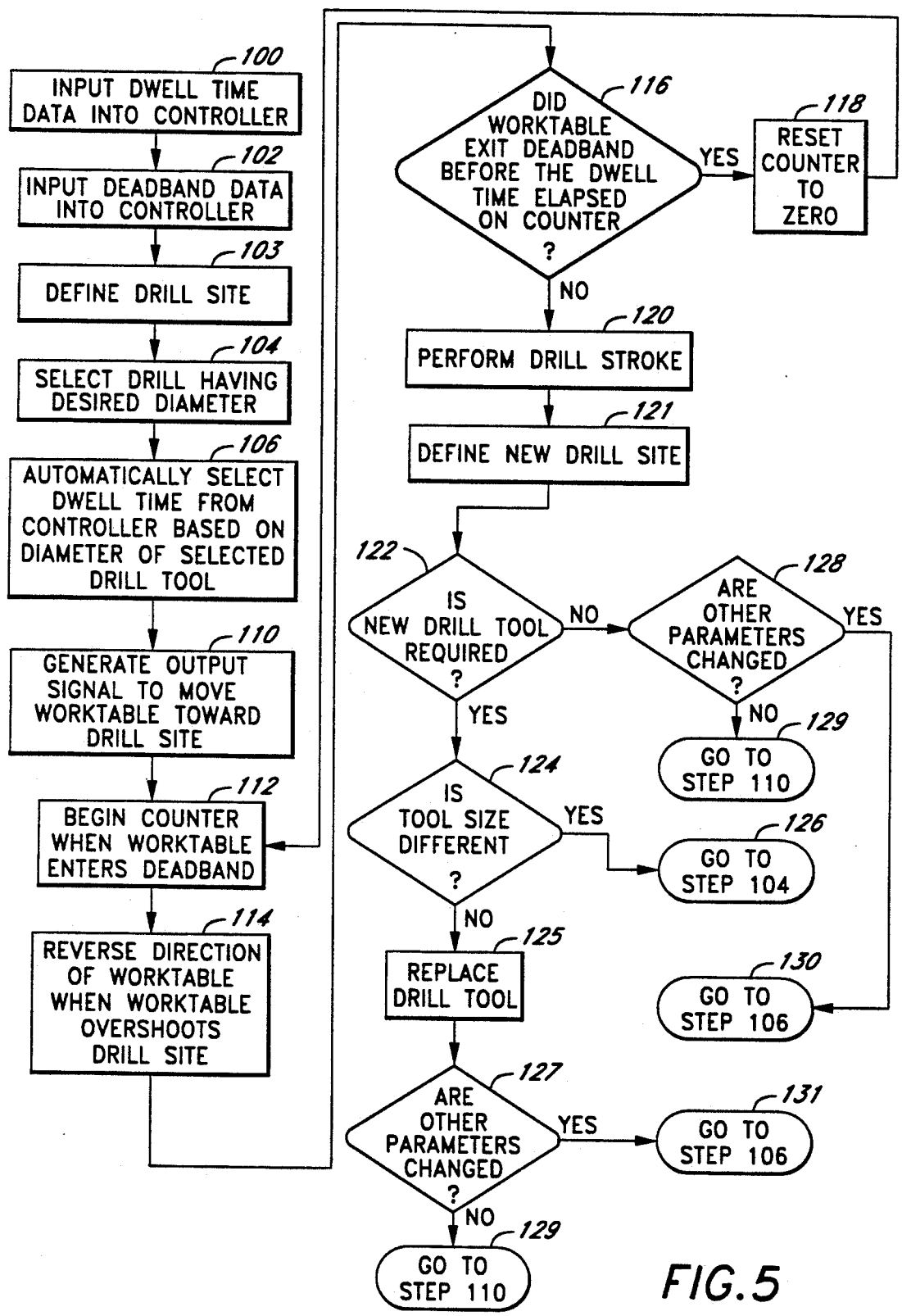
FIG. 5 is a flow chart illustrating the steps of the present invention.

Reference may herein generally be had to FIG. 5 which is a flow chart illustrating a series of steps preferably followed in practicing the present invention. To effect movement of the worktable 14, the controller 42 provides an output to the worktable movement assembly 11. The output normally comprises a signal to effect a desired direction of movement and a velocity of the worktable 14. The direction and velocity are calculated by the controller 42 to move the worktable 14 into proper position below the spindles 18 so that the spindles 18 drill at predefined drill sites on the printed circuit boards 30. The velocity output is sent to the worktable movement assembly at regular intervals, for example every millisecond. The movement assembly 11 then attempts to accelerate or decelerate the worktable 14 in order to bring the worktable 14 to the output velocity. It will be apparent, however, that in practice there is some delay between the output of the desired velocity signal from the controller 42 and actual achievement by the worktable 14 of the desired velocity. Therefore, the exact prediction of the future position of the worktable 14 is impractical, and continuous reference must be made by the controller to the input from the positioning scale 34.

As the worktable 14 approaches the drill site, the magnitude of the velocity output signal decreases to decelerate the worktable 14 to position the worktable 14 at the drill site. However, it is desirable for the worktable 14 to approach the drill site at a relatively high velocity so that the drill site is reached more rapidly in order to maintain the overall throughput of the drilling machine 10 at a high level. As a consequence, the worktable 14 often initially passes or "overshoots" the drill site. When this occurs, the controller reverses the direction of movement of the worktable 14 and calculates and outputs a new velocity signal to move the worktable 14 back toward the desired drill site. The worktable 14 often again overshoots the drill site whereupon the direction of movement is again reversed and new velocities are calculated and output to the movement means 26 to bring the worktable 14 to the precise location of the predefined drill site. During this process, the actual location of the worktable 14 is continuously input to the controller 42 from the positioning scale 34. At each iteration, the worktable 14 position becomes more refined and the worktable 14 is moved closer and closer to the exact location or X-Y coordinates of the drill site.

Because of the large mass of the worktable 14, many oscillations about the drill site are required for precise positioning. Because of the time delay during these oscillations, the exact drill site is often never achieved before a drilling operation. Rather, the worktable 14 is positioned sufficiently close to the exact location of the drill site so that a hole drilled will have sufficient placement accuracy so as to suffice for the intended practical application of the circuit board 30. Therefore, because exactly achieving the drill location is unnecessary and time consuming, the controller 42 will instruct the drilling spindle 18 to initiate the drilling stroke when the actual location of the worktable 14 is within a predetermined field or zone around the exact target drill site for a specified amount of time. This predetermined field is termed the "deadband." Initiation of the drilling stroke occurs when the worktable 14 is within the deadband for a period of time known as the "dwell time."

Figure 3:
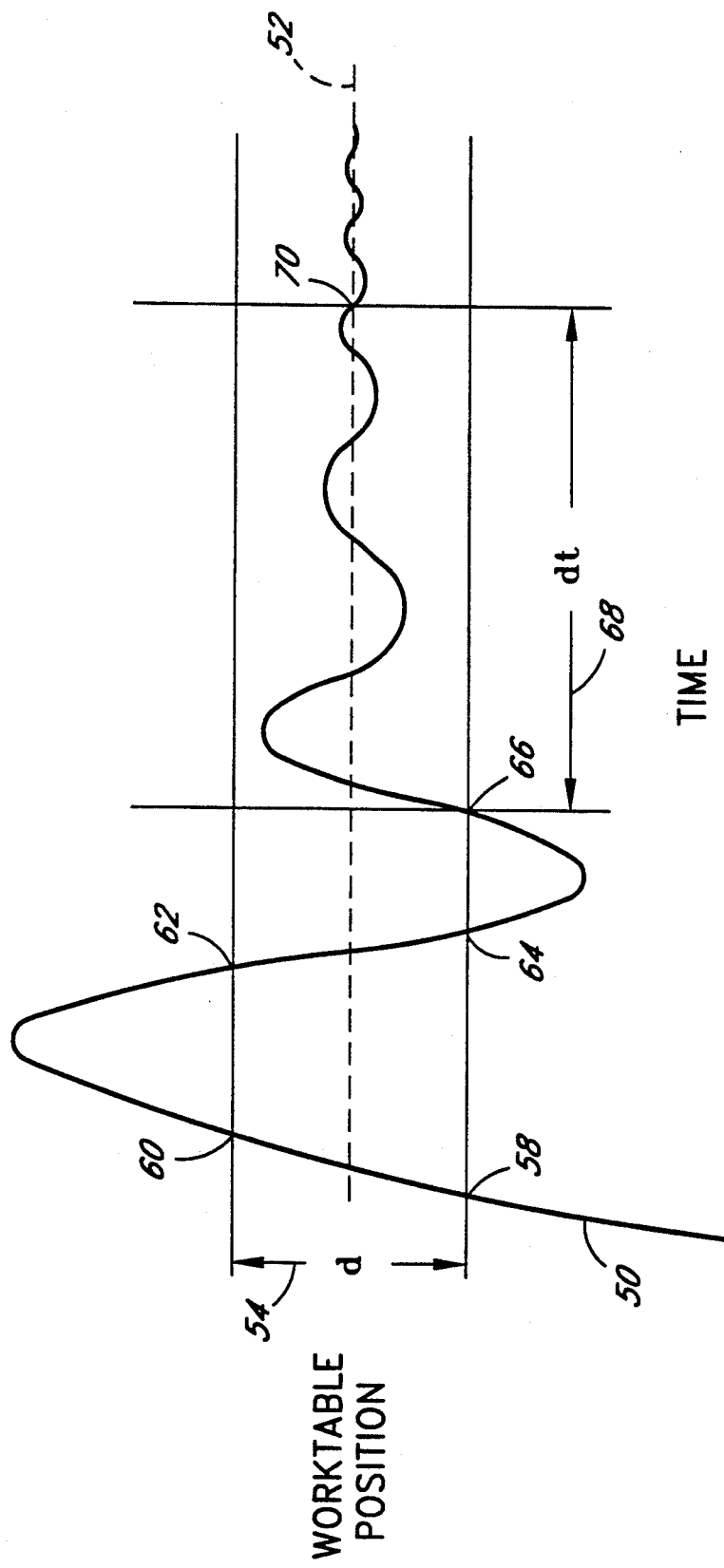
FIG. 3 is a graph showing the position of a drill tool over time relative to a desired drilling location.

Referring to FIG. 3, an oscillating wave 50 is shown which represents the actual position of the worktable 14 over time relative to the exact target drill site which is denoted by a dotted horizontal center line 52. As the worktable 14 approaches the drill site, the worktable 14 moves into the deadband, denoted by the letter "d" and the numeral 54. Upon entering the deadband 54 at location 58, a dwell time counter in the controller, is started to keep track of the amount of time that the worktable 14 is within the deadband 54. At location 60, the worktable 14 has overshot the drill site or center line 52, and has exited the deadband 54. Upon exiting the deadband 54, the dwell time counter is reset. The controller then sends a signal to reverse the direction of the worktable 14 and the worktable 14 is again moved toward the drill site or center line 52. At location 62, the worktable 14 reenters the deadband 54 and the dwell time counter is start again from zero. At location 64, the worktable 14 has again overshot the drill site and has again exited the deadband 54, whereupon the counter is again reset. At location 66, the worktable 14 again enters the deadband 54 and the counter is started anew. In this iteration, however, the direction of the worktable 14 is reversed by the controller 42 before the worktable 14 exits the deadband 54. The dwell time counter will continue to run as long as the worktable 14 position remains within the deadband 54.

As the controller 42 oscillates the worktable 14 in an attempt to position the worktable 14 at the exact drill site, the worktable 14 more closely approaches the exact drill site. Once the worktable 14 has been within the deadband 54 for the duration of the dwell time, which is denoted in FIG. 2 by the letters "dt" and by numeral 68, as determined by the dwell time counter, the worktable 14 is considered to have moved sufficiently close to the drill site. At this point, the worktable 14 is close enough to the drill site to achieve sufficiently accurate hole placement and hole quality. The drill stroke is thus initiated once the dwell time 68 has expired, namely at location 70. During the drill stroke, the controller 42 will continue to refine the position of the worktable 14 by small amounts although such adjustments are sufficiently small in magnitude so as not to prevent obtaining the desired hole placement accuracy and hole quality.

As will be readily apparent, the smaller the diameter of the hole drilled, the more precision and accuracy that is required during drilling of the hole. For example, a hole placement error of 0.01 inches in drilling a 0.25 inch diameter hole is small in relation to the hole size. Conversely, the same error in drilling a 0.005 inch diameter hole would be an unacceptably large drilling error.

The present invention increases the throughput of circuit board drilling machines by automatically adjusting the dwell time to an optimal level each time the drill tool is changed. Whereas in the prior art a preselected nominal dwell time is used for any given drilling operation, the present apparatus and method provides for automatically adjusting the dwell time used by the controller 42 according to various drilling parameters in order to maximize the efficiency of the drilling machine 10. Although the prior art permitted the operator to adjust the dwell time, it was impractical to adjust the dwell time each time the drill tool was changed.

One drilling parameter used is the size or diameter of the drill tool which is equivalent to the diameter of the hole to be drilled. For example, where a smaller hole is to be drilled, the controller will assign a longer dwell time to allow the worktable 14 to achieve a more precise position in relation to the drill spindle 18 before initiation of the drill stroke. Conversely, where relatively large holes are to be drilled, the controller will assign a shorter dwell time because less hole position accuracy is required.

Another parameter affecting the dwell time that will be used is the hole accuracy desired for the particular application for which holes are being drilled in the printed circuit boards 30. In some applications, it is necessary to produce holes having a high placement accuracy. Consequently, a longer dwell time must be used to allow the worktable 14 to be positioned more precisely. Where a high drilling machine throughput is desired at the cost of some degree of hole placement accuracy, a shorter dwell time is used. Other possible parameters affecting the dwell time to be used are user preferences, workload requirements of the drilling machine 10, and the type of material being drilled.

Further, in accordance with the present invention, a data source provides different predetermined dwell times to be used by the controller 42, wherein the dwell times correspond to the various drilling parameters described above. Preferably, the data source is stored in the computer memory device 46 accessible by the controller 42 so that the controller 42 may easily and rapidly access the information or data contained therein. The dwell times stored in the data source will generally be formulated by the machine manufacturer or by the machine user through practical experimentation to determine the optimal dwell times under a variety of drilling conditions. In the preferred embodiment, the data source comprises a reference table stored in the computer memory device wherein the drilling parameters comprise the indices of the reference table and the dwell times are values entered into the reference table under appropriate cross-references of the indices. An example of one such table is shown in FIG. 4. As can be seen, an appropriate dwell time 84 to be used by the controller 42 is determined by cross-referencing the level of desired hole accuracy 88 against the size 90 of the hole to be drilled. Generally, a longer dwell time 84a is used for drilling operations requiring high accuracy and for drilling smaller holes, while a shorter dwell time 84b is used for drilling operations not requiring high accuracy and for drilling larger holes.

Referring now to FIG. 5, a flow chart is shown demonstrating the steps of the present invention. At block 100, during initialization or "set-up," dwell time data is input into the controller 42 and is stored therein. At block 102, the nominal deadband for the machine 10 is likewise input into the controller 42. The steps performed at block 100 and 102 are generally only performed during initial machine set-up and need not be repeated each time a new drilling operation is performed. At block 103, a drill site is defined. At block 104, a drill tool is selected having a desirable diameter for drilling. Next, at block 106, a dwell time for a drilling operation is automatically selected from the dwell time data based on the diameter of the selected drill tool in order to optimize the speed and accuracy of the drilling operation. At block 110, a signal is output to the worktable 14 to move the worktable 14 toward the drill site. The deadband counter begins counting when the worktable 14 enters the deadband at block 112. When the worktable 14 overshoots the drill site, the direction of the worktable 14 is reversed at block 114. At decision block 116, if the worktable 14 exits the deadband before the dwell time has elapsed on the deadband counter, the counter is reset to zero at block 118 and the flow sequence returns to block 112 with the counter beginning when the worktable enters the deadband. If, on the other hand, the worktable 14 did not exit the deadband before the counter elapsed, the drill stroke is performed at block 120. Next, at block 121 a new drill site is defined. At decision block 122, if a new drill tool is required after the drill stroke, it is queried whether the size of the drill tool is being changed at block 124. If the size of the drill tool is changed, at block 126 the flow sequence returns to block 104. If the size of the drill tool is not changed, at block 125 the drill tool is replaced. A determination is then made at decision block 127 whether other parameters have changed. If so, at block 131 the flow sequence returns to block 106 and the automatic selection of the dwell time from the controller based on the diameter of the selected drill tool. If the other parameters have remained the same, at block 129 the flow sequence returns to block 110 and the generation of an output signal to move the worktable toward the drill site.

The present invention is advantageous in several respects. Frequently, holes of varied diameters must be drilled in a printed circuit board 30. Automatic drill tool changing devices, which are used commonly in the field, automatically change a drill tool when a tool having a different diameter is desired or if a particular drill tool is worn. When a tool having a different size from a previously used tool is mounted into the drilling spindle, the controller 42 automatically refers to the reference table 80 to determine the optimal dwell time 84 for the impending drilling operation(s) using the newly selected tool. Similarly, if a different degree of hole accuracy 88 is desired or if the drilling material is changed, the controller 42 automatically refers to the reference table 80 to determine the appropriate dwell time 84 to use under the particular designated drilling conditions. Thus, it can be seen that automatically setting and adjusting dwell times 84 maximizes drilling machine throughput while achieving an acceptable or sufficient degree of hole placement accuracy for each hole drilled.

In addition to achieving superior hole placement accuracy, the present method also enables one practicing the invention to achieve an acceptable degree of hole quality according to the particular application for which the holes are drilled. Where the dwell time 84 is not sufficiently long, the worktable 14 will frequently be oscillating too severely during the drilling stroke, thereby resulting in poor hole quality. Poor hole quality usually manifests itself in holes which are non-vertical or slanted and holes having rough inner walls. The desired degree of hole quality is achieved by automatically adjusting the dwell time 84 to correspond to the applicable drilling conditions. Further, automatically adjusting the dwell time 84 in response to drilling conditions also decreases the likelihood of drill tool breakage caused by drilling a hole with a small diameter drill tool while oscillation of the worktable 14 is still too severe.

Having described the invention in connection with certain specific embodiments thereof, it is to be understood that further modifications may now suggest themselves to those skilled in the art, and it is intended to include such modifications as fall within the scope of the claims hereof.

I claim:

1. In a printed circuit board drilling machine having a worktable movable in a horizontal plane, a worktable movement assembly on said drilling machine for moving said table in said horizontal plane, and a controller for controlling the operation of the drilling machine, said controller transmitting movement instructions to said movement assembly to move said worktable toward a target position comprising a predetermined desired hole drilling location on a printed circuit board, a method of rapidly drilling holes in a printed circuit board mounted on said worktable at a series of drill sites, wherein each of said series of drill sties comprises an actual location where a given hole is drilled, said method maintaining a sufficient degree of hole placement accuracy and quality, said method comprising the steps of:

inputting data into said controller, said data comprising a plurality of dwell times wherein each of said plurality of dwell times comprises a predetermined time delay which must elapse while said worktable remains within a given deadband comprising a predetermined zone surrounding each said target position before said drilling machine initiates a drill stroke, wherein said dwell times are selected to provide a relatively short delay time between said worktable entering a given deadband and initiating said drill stroke while achieving sufficient hole placement accuracy and wherein said dwell times depend upon and are determined by one or more drilling parameters, including at least one of:

a given diameter of a given drill tool; and a desired degree of placement accuracy of a given hole to be drilled;

selecting a first drill tool for drilling a first hole in said printed circuit board wherein said first drill tool has a first diameter;

mounting said first drill tool into a spindle on the drilling machine;

automatically setting a dwell time for delaying drilling said first hole, wherein said setting step includes a step of selecting said dwell time from said plurality of dwell times;

moving said worktable using said worktable movement assembly toward said target position on said printed circuit board for drilling said first hole;

delaying drilling said first hole for the duration of said dwell time so that said movement assembly has sufficient time to position said worktable in order to achieve said sufficient hole placement accuracy;

drilling said first hole after said dwell time has elapsed; and repeating said inputting, selecting, mounting, setting moving, delaying and drilling steps for each of said series of drill steps.

2. The method of claim 1, including the steps of:

designating a deadband surrounding said desired drill location; and counting said dwell time beginning from the point in time when said worktable comes within said deadband.

3. A method of drilling a series of drill sites in a workpiece using a drilling machine wherein each of said series of drill sites comprises an actual location where a given hole is drilled, said method comprising the steps of:

providing a plurality of dwell times wherein each of said plurality of dwell times comprises a predetermined time delay which must elapse while said worktable remains within a given deadband comprising a predetermined, zone surrounding each predetermined desired hole drilling location on said workpiece before said drilling machine initiates a drill stroke, wherein said dwell times vary according to one or more predefined drilling parameters;

selecting a drill tool having a first diameter;

automatically selecting from said plurality of predefined dwell times and in accordance with said parameters a dwell time corresponding to a set of conditions of a drilling operation, wherein said dwell time is selected in order to obtain a satisfactory degree of hole placement accuracy and hole quality with respect to a hole drilled during said drilling operation having said set of conditions while optimizing the speed with which said hole is drilled;

moving said drill tool and said predetermined desired hole drilling location on said workpiece relatively closer in order to close a distance between said drill tool and said location; and delaying initiation of said drilling operation from the time said worktable enters said deadband until said dwell time elapses without said worktable exiting said deadband to allow said distance to become sufficiently small to obtain said satisfactory degree of hole placement accuracy and hole quality; and repeating said providing, selecting, moving and delaying steps for each of said series of drill steps.

4. The method of claim 3, wherein said step of providing a plurality of predefined dwell times comprises the steps of:

formulating a reference table having said drilling parameters as indices and having said predefined dwell times as entered values; and storing said reference table in a computer memory device accessible by said controller so that said controller may automatically access and obtain said dwell times from said device.

5. The method of claim 4, wherein one of said predefined parameters is said first desired diameter of said drill tool.

6. The method of claim 4, wherein one of said predefined parameters is a desired degree of hole placement accuracy.

7. The method of claim 4, wherein said workpiece is mounted on a worktable and wherein the worktable moves in a horizontal plane to position said workpiece for drilling said hole.

8. The method of claim 4, wherein said drilling machine includes a dwell time counter, said method further including the steps of:

defining a zone about said desired drilling location;

starting said counter when said drill tool enters said zone; and initiating said drilling operation after said dwell time has elapsed on said counter.

9. The method of claim 8, wherein said counter is reset to zero whenever said drill tool exits said zone.

10. A drilling machine for rapidly and efficiently drilling a series of drill sites in a workpiece, wherein each of said series of drill sites comprises an actual location where a given hole is drilled, comprising:

a worktable movable in a horizontal plane, said workpiece being securely mounted on said worktable;

a worktable movement assembly for moving said worktable in said horizontal plane, said movement assembly being capable of moving said worktable in small and precise increments;

a spindle mounted above said worktable, said spindle adapted to have a drill tool mounted therein;

means for automatically changing the drill tool mounted in the spindle; and a computer controller for controlling said drilling machine system wherein said controller comprises a memory device having a data source stored therein, said data source containing a plurality of dwell times wherein each of said plurality of dwell times comprises a predetermined time delay which must elapse while said worktable remains within a given deadband comprising a predetermined zone surrounding each predetermined desired hole drilling location on said workpiece before said drilling machine initiates a drill stroke, wherein said dwell times vary in accordance with the diameter of any given drill tool used in a given drilling operation, so that one of said dwell times may be automatically and rapidly selected from said data source to correspond to a diameter of the drill tool selected by said automatic changing means in order to optimize the efficiency of said system and the quality of holes drilled.

11. In a printed circuit board drilling machine having a worktable, a spindle, a movement assembly on said drilling machine for controlling movement of said worktable relative to said spindle in a horizontal plane and a controller for controlling the operation of the drilling machine, said controller transmitting movement instructions to said movement assembly, a method of rapidly drilling holes at a series of drill sites proximate a target position comprising a predetermined desired hole drilling location wherein each drill site of said series of drill sites comprises an actual location where a given hole is drilled, said method maintaining a sufficient degree of hole placement accuracy and quality, said method comprising the steps of:

inputting data into said controller, said data comprising a plurality of dwell times wherein each of said plurality of dwell times comprises a predetermined time delay which must elapse while said spindle remains within a given deadband comprising a predetermined zone surrounding each said target position before said drilling machine initiates a drill stroke, wherein said dwell times are selected to provide a relatively short delay time between said spindle entering a given deadband and initiating said drill stroke while achieving sufficient hole placement accuracy and wherein said dwell times depend upon and are determined by one or more drilling parameters, including at least one of:

a given diameter of a given drill tool; and a desired degree of placement accuracy of a given hole to be drilled;

selecting a first drill tool for drilling a first hole in said printed circuit board wherein said first drill tool has a first diameter;

mounting said first drill tool into said spindle on the drilling machine;

automatically setting a dwell time for delaying drilling said first hole, wherein said setting step includes a step of selecting said dwell time from said plurality of dwell times;

causing relative movement of said table relative said spindle, so that said spindle is moved toward a given target position on said printed circuit board for drilling said first hole;

delaying drilling said first hole for the duration of said dwell time so that said movement assembly has sufficient time to position said spindle to achieve said sufficient hole placement accuracy; and drilling said first hole after said dwell time has elapsed.

12. The method of claim 11, wherein said method includes repeating said inputting, selecting, mounting, setting, causing, delaying and drilling steps for each of said series of drill sites.

* * * * *